(12) United States Patent
Downes

(10) Patent No.: US 6,347,734 B1
(45) Date of Patent: Feb. 19, 2002

(54) METHODS AND APPARATUS FOR INSTALLING A MODULE ON A CIRCUIT BOARD USING HEATING AND COOLING TECHNIQUES

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/536,194

(22) Filed: Mar. 27, 2000

(51) Int. Cl.$^7$ .............................................. B23K 31/02
(52) U.S. Cl. ................. 228/180.21; 228/200; 228/20.1; 228/46
(58) Field of Search .............................. 228/119, 180.1, 228/180.21, 180.22, 200, 222, 264, 6.2, 20.1, 46; 239/128, 135

(56) References Cited

U.S. PATENT DOCUMENTS

| | | | | |
|---|---|---|---|---|
| 3,710,069 A | * | 1/1973 | Papadopoulos et al. | |
| 4,390,120 A | * | 6/1983 | Broyer | |
| 4,771,929 A | * | 9/1988 | Bahr et al. | |
| 5,139,193 A | * | 8/1992 | Todd | |
| 5,577,658 A | * | 11/1996 | Bailey et al. | |
| 5,785,233 A | * | 7/1998 | Nutter et al. | |
| 5,846,073 A | * | 12/1998 | Weaver | |
| 6,145,734 A | * | 11/2000 | Taniguchi et al. | |
| 6,257,478 B1 | * | 7/2001 | Straub | |

FOREIGN PATENT DOCUMENTS

| | | | | |
|---|---|---|---|---|
| JP | 404200860 A | * | 9/1992 | |
| JP | 411329926 A | * | 11/1999 | |

* cited by examiner

*Primary Examiner*—Tom Dunn
*Assistant Examiner*—Kiley Stoner
(74) *Attorney, Agent, or Firm*—Chapin & Huang, L.L.C.; David E. Huang

(57) ABSTRACT

The invention is directed to techniques for installing a module on a circuit board by simultaneously heating a perimeter portion of the module, and bringing an inner portion of the module to temperature that is lower than that of the perimeter portion. Heating the perimeter portion of the module melts solder disposed between contact members of the module and corresponding contact members of the circuit board in order to form solder connections. Bringing the inner portion of the module to temperature that is lower than that of the perimeter portion reduces the likelihood of causing heat-related damage to the module itself. One arrangement of the invention is directed to a module installation system for installing a module on a circuit board. The module has a perimeter portion and an inner portion. The module installation system includes a heating source, a cooling source, and a nozzle coupled to the heating and cooling sources. The nozzle is configured to simultaneously heat the perimeter portion of the module, and cool the inner portion of the module in order to install the module on the circuit board. Accordingly, contact members around the perimeter portion of the module can form solder connections with the circuit board while cooling of the inner portion of the module protects the inner portion from heat-related damage. For example, if the module is an MCM, solder joints connecting MCM components at the inner portion to the MCM board will be less likely to reflow and cause a failure. In a preferred arrangement, the heating source provides a first fluid (i.e., a gas or a liquid), and the cooling source provides a second fluid. In one arrangement, the nozzle applies the first fluid to an area adjacent the perimeter portion of the module, and the second fluid to an area adjacent the inner portion of the module.

31 Claims, 8 Drawing Sheets

METHODS AND APPARATUS FOR INSTALLING A MODULE ON A CIRCUIT BOARD USING HEATING AND COOLING TECHNIQUES

BACKGROUND OF THE INVENTION

A typical circuit board can include a variety of circuit board modules, i.e., components, such as integrated circuits (ICs), capacitors, resistors, connectors, and so on. These circuit board modules typically connect with a multi-layered board formed of conductive and non-conductive circuit board material (e.g., copper and fiberglass, respectively).

Some circuit boards include complex modules which have multiple components mounted on a miniature circuit board, i.e., a small section of circuit board material. Such a module is often called a multi-chip module (MCM) because it typically includes multiple ICs, i.e., multiple "chips". Some MCMs include components mounted exclusively on a top surface of the miniature circuit board (hereinafter called an "MCM board" to distinguish it from the main circuit board onto which the MCM mounts). Other MCMs include components mounted on both a top surface and a bottom surface of the MCM board. Typically, contact members (e.g., pins, pads, etc.) of the MCM components connect with corresponding contact members (e.g., vias) of the MCM board at solder joints.

In a similar manner, modules (MCMs and non-MCMs) typically connect with circuit boards at solder joints. Some modules mount to circuit boards using ball grid array (BGA) technology. Mounting a module to a circuit board using BGA technology involves using a grid of solder balls (i.e., beads of solder) between pads of the module and corresponding pads of the circuit board. Applied heat melts the solder balls to form solder joints between the pads of the module and the circuit board.

In general, large circuit board fabrication facilities manufacture circuit boards on a large scale and under tightly controlled environmental conditions (i.e., temperature, humidity, etc.) in a highly automated manner (e.g., using large scale computer controlled automated equipment). Accordingly, manufacturing yields at such facilities are generally consistent and high.

Nevertheless, on occasion, a manufactured circuit board may operate improperly. In some cases, such improper operation may be due to a faulty module, i.e., a defective or improperly mounted module. A computerized circuit board analyzer may be able to test and identify the module causing the failure. In such a situation, a technician may be able to "rework" the circuit board by removing the faulty module and replacing it with a new one. To this end, the technician removes the faulty module using an assembly rework station. A typical assembly rework station includes a heated gas source, a vacuum source and a special nozzle that is adapted to fit over the faulty module which is mounted to the circuit board. In general, the technician lowers the nozzle over the module, applies heated gas through the nozzle to melt solder connections holding the module to the circuit board, and applies a vacuum (typically through a pipe in the middle of the nozzle) to lift the module from the circuit board once the solder connections have melted.

After the technician removes the failed module from the circuit board using the assembly rework station, the technician typically cleans out the installation location of the circuit board (e.g., removes any remaining solder debris), loads the nozzle with a new module (e.g., fastens the new module within the nozzle using the vacuum), and positions the nozzle holding the new module on the cleaned installation location. The technician then applies heated gas through the nozzle to thoroughly heat the module such that solder on contact members of the module (and perhaps additional solder placed at the installation location) melts to form new solder connections with the circuit board.

The nozzles of some assembly rework stations are configured to apply heated gas to a module, and apply cooler gas (e.g., room temperature gas) exclusively around a periphery of the module. In particular, as a technician operates the nozzle of such an assembly rework station to remove a faulty module from a circuit board or to install a new module onto a circuit board, the nozzle of the assembly rework station applies the heated gas to all parts of the module to melt solder between the module and the circuit board, and the cooler gas around the outside edges of the module to prevent the solder connections of the neighboring circuit board modules from re-melting or re-flowing.

SUMMARY OF THE INVENTION

Unfortunately, conventional assembly rework stations, which apply heated gas to install new modules on circuit boards, do not adequately protect the new modules against heat-related damage. For example, when a technician installs a new multi-chip module (MCM), i.e., a module formed by multiple components soldered to a miniature circuit board (an MCM board), onto a main circuit board, the application of heated gas to the new MCM can melt solder connections between MCM components and the MCM board. In some cases, the reflowing of solder can form unreliable cold solder joints between the MCM components and the MCM board. In more extreme cases, the reflowing of solder can result in components falling off the MCM board. Even if the module being installed is not an MCM, the module can sustain damage to internal circuitry due to the extreme temperatures of the heated gas. Such damage can be particularly costly when the new modules have already undergone thorough manufacturing and testing procedures prior to their installation on circuit boards during reworking of the circuit boards.

In contrast, the present invention is directed to techniques for installing a module on a circuit board by simultaneously heating a perimeter portion of the module, and bringing an inner portion of the module to a temperature that is lower than that of the perimeter portion. Heating the perimeter portion of the module melts solder disposed between contact members of the module and corresponding contact members of the circuit board in order to form solder connections. Bringing the inner portion of the module to a temperature that is lower than that of the perimeter portion reduces the likelihood of causing heat-related damage to the module itself.

One arrangement of the invention is directed to a module installation system for installing a module on a circuit board. The module has a perimeter portion and an inner portion. The module installation system includes a heating source, a cooling source, and a nozzle coupled to the heating and cooling sources. The nozzle is configured to simultaneously heat the perimeter portion of the module, and cool the inner portion of the module in order to install the module on the circuit board. Accordingly, contact members around the perimeter portion of the module can form solder connections with the circuit board while cooling of the inner portion of the module protects the inner portion from heat-related damage. For example, if the module is an MCM, solder joints connecting MCM components to the MCM board at the inner portion will be less likely to reflow and cause a failure.

In a preferred arrangement, the heating source provides a first fluid (a gas or a liquid), and the cooling source provides a second fluid. As such, the nozzle applies the first fluid to an area adjacent the perimeter portion of the module, and the second fluid to an area adjacent the inner portion of the module. In one arrangement, the first and second fluids are gases, e.g., nitrogen, which the nozzle preferably applies at the substantially the same pressure (i.e., +/−10%), e.g., each at four pounds of pressure per square inch (psi). In another arrangement, the first fluid is a gas and the second fluid is a liquid (e.g., a gel).

In one arrangement, the nozzle includes a housing that (i) contacts the inner portion of the module and (ii) defines a chamber through which the second fluid is capable of passing. In this arrangement, the housing operates as a thermal mass (or thermal capacitor) to keep the inner portion of the module cooler as the perimeter portion of the module is heated.

In one arrangement, the housing further defines multiple baffles that extend into the chamber. Additionally, the nozzle further includes an input port that defines an opening leading into the chamber, and an output port that defines an opening leading from the chamber. In this arrangement, the second fluid is capable of passing through the input port leading into the chamber, over the multiple baffles, and through the output port leading from the chamber. The baffles facilitate temperature transfer between the second fluid and the housing which contacts the inner portion. As a result, the inner portion of the module stays at a lower temperature than the perimeter portion of the module.

In another arrangement, the housing further defines a bleed orifice. Additionally, the nozzle further includes an input port that defines an opening leading into the chamber, and an output port that defines an opening leading from the chamber. In this arrangement, the second fluid is capable of passing through the input port leading into the chamber, over the bleed orifice, and through the output port leading from the chamber. As the second fluid passes over the bleed orifice, the bleed orifice directs some of the second fluid (e.g., a cool gas) over a particular area of the inner portion to provide an enhanced localized cooling effect to that area. This feature of the invention is particularly useful when installing MCMs. That is, the directed second fluid can provide enhanced cooling to a particular MCM component mounted on a surface of the MCM board in order to provide better cooling of that component.

In one arrangement, solder resides between contact members of the perimeter portion of the module and the circuit board. Preferably, the heating source provides the first fluid at a temperature that is higher than a melting point of the solder, the cooling source provides the second fluid at a temperature that is lower than the melting point of the solder.

Another arrangement of the invention is directed to a module installation system for installing a module on a circuit board using multiple heating sources. The module has a first portion and a second portion. The module installation system includes a first heating source, a second heating source, and a nozzle coupled to the first and second heating sources. The nozzle is configured to simultaneously (i) heat the first portion of the module to a first temperature, and (ii) heat the second portion of the module to a second temperature that is lower than the first temperature, in order to install the module on the circuit board.

In one arrangement, the first portion of the module is a perimeter portion of the module, and the second portion of the module is an inner portion of the module. In this arrangement, the nozzle preferably is configured to apply a fluid at the first temperature to an area adjacent the perimeter portion of the module, and a fluid at the second temperature to an area adjacent the inner portion of the module. This arrangement enables the nozzle of the module installation system to duplicate a heating profile which is typical of large furnace fabrication facilities that produce circuit boards on a large scale. The heating profile can include a heat soke phase in which both the inner and perimeter portions of the module are heated to stable temperatures with a stable temperature difference, i.e., the inner portion being heated to a stable temperature that is lower than that of the perimeter portion. The heating profile can further include a subsequent temperature spike that raises the temperatures of the perimeter portion (and perhaps the inner portion, but preferably to a lesser degree) in order to melt solder between the module and the circuit board. A benefit of this arrangement is that the temperature differential between the inner portion and the perimeter portion remains relatively close thus minimizing stresses and possible damage that could otherwise result from greater temperature differences.

The features of the invention, as described above, may be employed in electronic systems and related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The invention is directed to techniques for installing a module on a circuit board by simultaneously heating a perimeter portion of the module, and bringing an inner portion of the module to a temperature that is less than the perimeter portion. Heating the perimeter portion of the module melts solder disposed between contact members of the module and corresponding contact members of the circuit board in order to form solder connections. Bringing the inner portion of the module to a temperature that is less than the perimeter portion reduces the likelihood of causing heat-related damage to circuitry at the inner portion. The techniques of the invention may be employed in module installation systems and other related devices such as those manufactured by EMC Corporation of Hopkinton, Mass.

Figure 1:
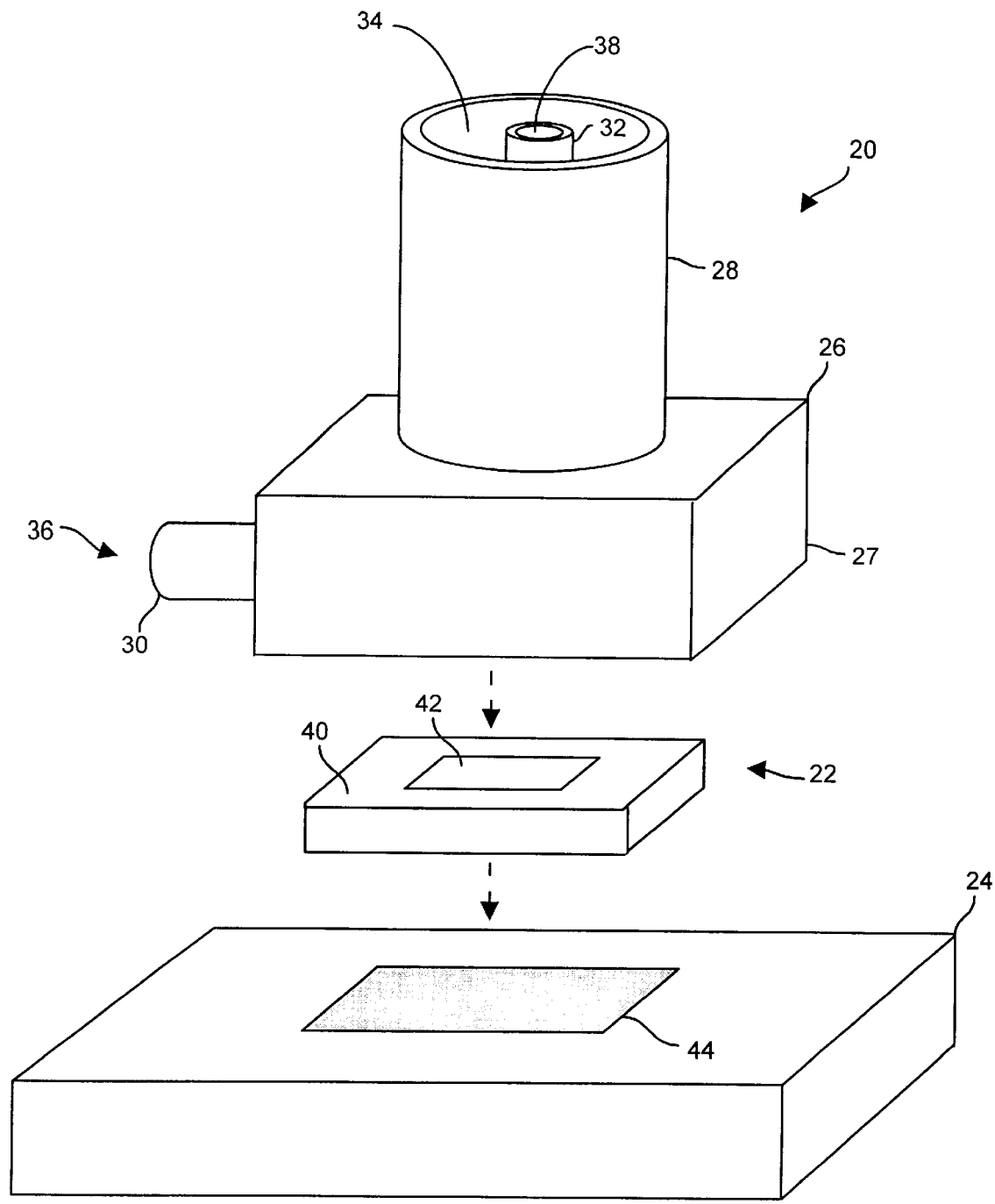
FIG. 1 is a perspective view of an installation arrangement which includes a nozzle that simultaneously heats a perimeter portion of a module, and brings an inner portion of the module to a temperature that is lower than that of the perimeter portion, when installing the module on a circuit board.

FIG. 1 shows a perspective view of a nozzle 20 which is suitable for use by the invention. The nozzle 20 applies multiple temperatures to a module 22 when installing the module 22 on a circuit board 24. As shown in FIG. 1, the nozzle 20 includes a housing 26 having a base portion 27 and an upper portion 28. The nozzle 20 further includes a port 30, and a vacuum tube 32. In one arrangement, the nozzle 20 is a metallic manifold-like tool which is formed from finely crafted cast and welded parts.

The upper portion 28 of the housing 20 and the vacuum tube 32 define a first fluid passage 34 through which a first fluid (a gas or a liquid) is capable of passing. Similarly, the port 30 defines a second fluid passage 36 through which a second fluid is capable of passing. As shown in FIG. 1, the vacuum tube 32 further defines a vacuum passage 38 through which a vacuum is capable of being applied to the module 22 in order to hold the module 22 within the nozzle 20.

The module 22 includes a perimeter portion 40 and an inner portion 42. During installation of the module 22 on the circuit board 24, the nozzle 20 heats the perimeter portion 40 and simultaneously brings the inner portion 42 to a temperature that is less than that of the perimeter portion 40. As shown in FIG. 1, the module 22 mounts to an installation location 44 of the circuit board 24. In one arrangement, the module 22 uses ball grid array (BGA) technology around the perimeter portion 40. That is, solder balls are fastened to pads on the lower surface of the perimeter portion 40. The solder balls melt during installation to form solder connections between the pads of the perimeter portion 40 of the module 22 and corresponding pads of the circuit board 24.

Figure 2:
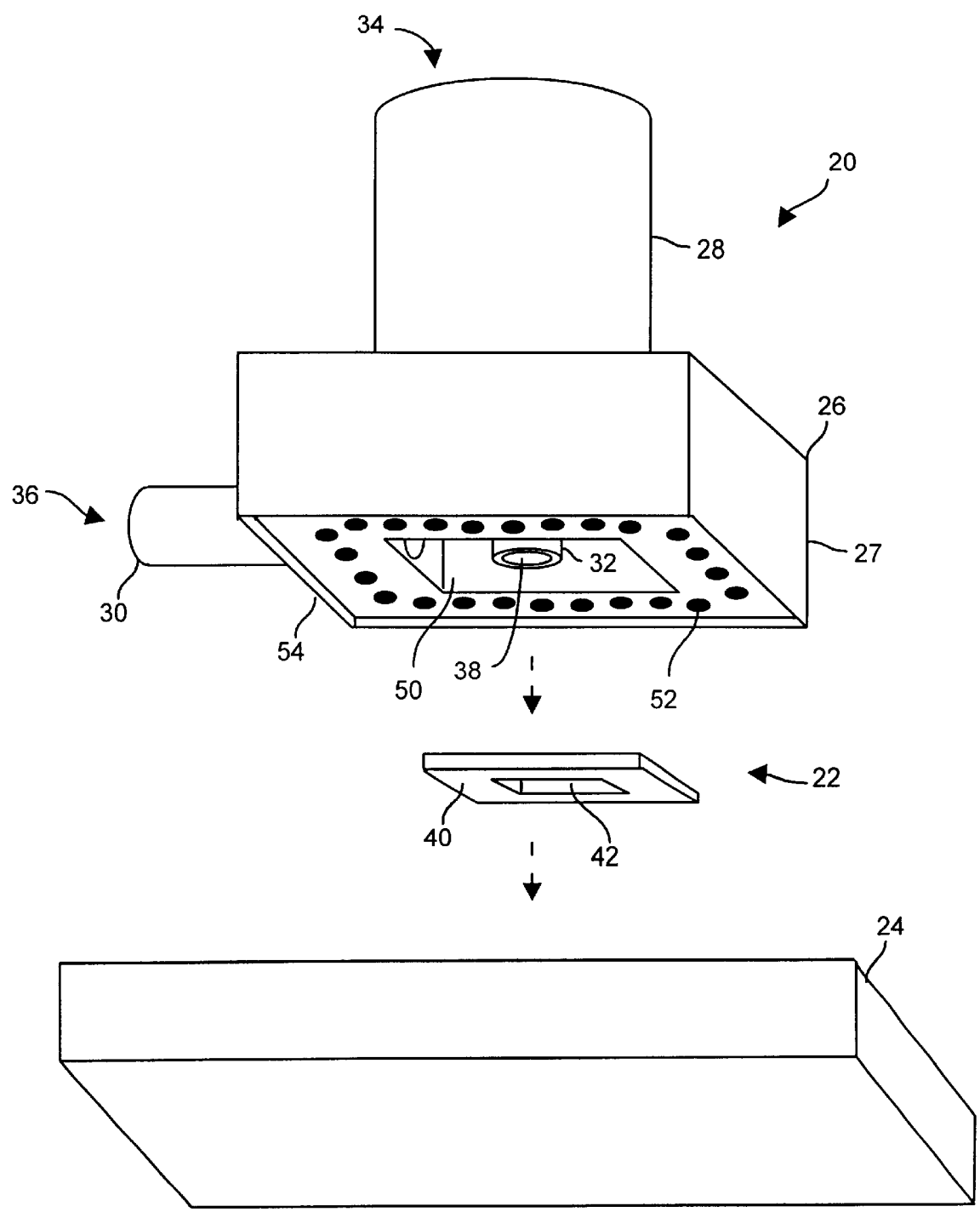
FIG. 2 is a different perspective view of the installation arrangement of FIG. 1.

FIG. 2 shows another perspective view of the nozzle 20 (i.e., looking up at the nozzle 20 rather than looking down as in FIG. 1). As shown in FIG. 2, the base portion 27 of the housing 26 defines a chamber 50. Preferably, the shape of the chamber 50 closely resembles the shape of the module 22. Accordingly, when the nozzle 20 is placed over the module 22 and a vacuum is applied to the module 22 through the vacuum passage 38 defined by the vacuum tube 32, the module 22 is held in place within the nozzle 20 by suction and the module 22 substantially separates the chamber 50 from the circuit board 24.

It should be understood that the first fluid passage 34 of the nozzle 20 preferably does not pass into the chamber 50. Rather, when the first fluid passage 34 reaches the base portion 27 of the housing 26, walls of the housing guide the first fluid passage 34 toward the periphery of the base portion 27 until the first fluid passage 34 terminates at multiple ducts 52, as shown in FIG. 2. Accordingly, heated fluid applied to the first fluid passage 34 will exit through the ducts 52.

As shown in FIG. 2, the base portion 27 of the housing 26 includes a ridge 54 which extends along the bottom edge of the nozzle. As such, if the module 22 is held within the nozzle 20 using a vacuum and if the nozzle 20 is placed flush against the circuit board 24, heated gas exiting the ducts 52 will not be blocked by the surface of the circuit board 24. Rather, the heated gas will be able to travel to locations adjacent the perimeter portion 40 of the module 22. In particular, the heated gas will be able to reach solder between contact members (e.g., pads) at the perimeter portion 40 of the module 22 and corresponding contact members at the installation location 44 of the circuit board 24 to form solder connections between the module 22 and the circuit board 24.

It should be further understood that the second fluid passage 36 of the nozzle 20 passes into the chamber 50. Accordingly, a second fluid that is cooler than the heated fluid (e.g., a cooled fluid, a room temperature fluid, or another heated fluid that is at a lower temperature than that of the first fluid) applied to the second fluid passage 36 will travel into the chamber 50 to a location adjacent the inner portion 42 of the module 22 to bring the temperature of the inner portion 42 to a temperature that is less than that of the perimeter portion 40. In one arrangement, the second fluid is at a temperature that is less than or equal to room temperature in order to cool the upper surface of the inner portion 42 of the module 22, and generate a cooling affect through the inner portion 42 of the module 22 to reduce the temperature of the bottom surface of the inner portion 42.

Figure 3:
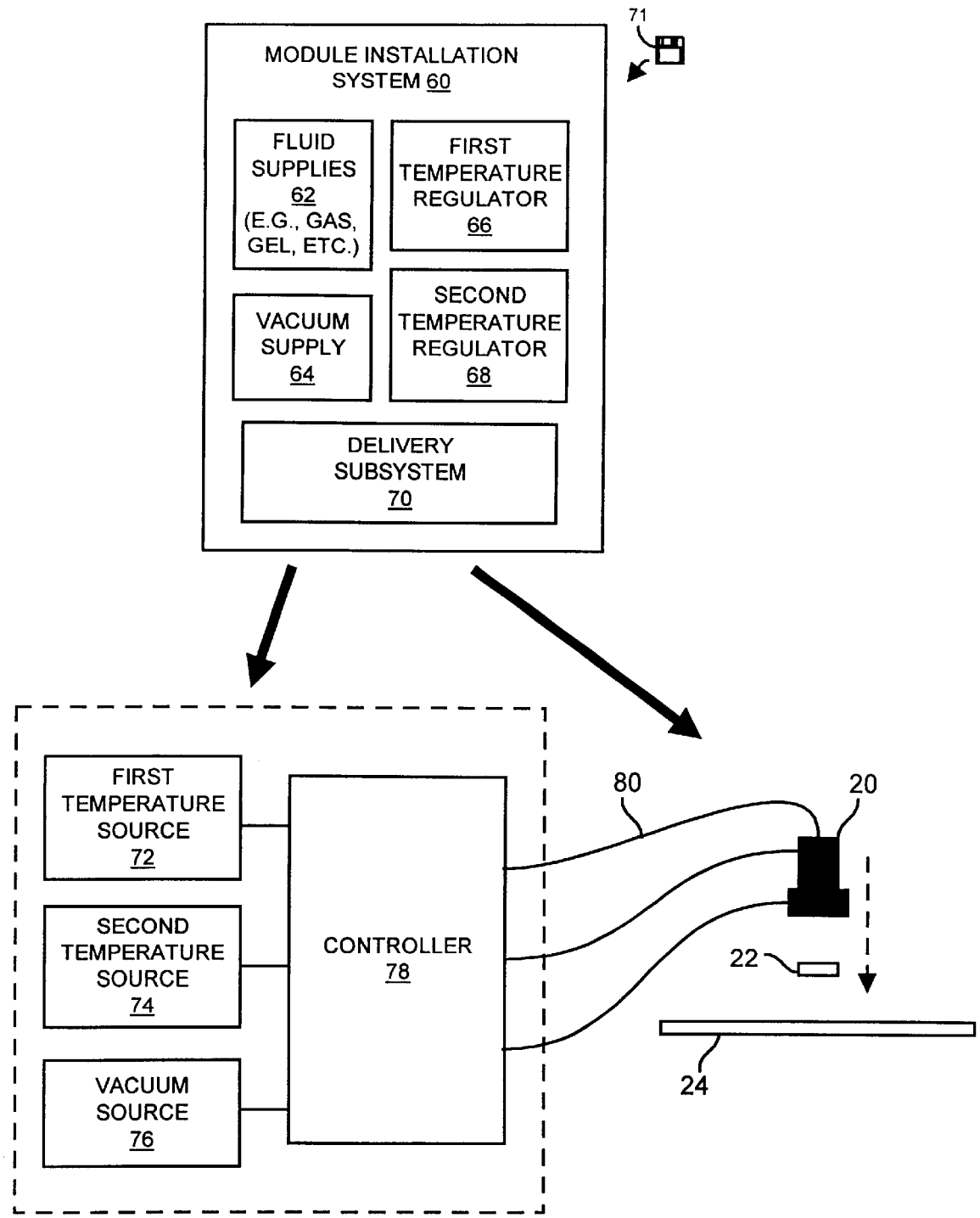
FIG. 3 is a block diagram of a module installation system which uses the nozzle of FIG. 1.

FIG. 3 shows a module installation system 60 which is suitable for use by the invention. The module installation system 60 includes fluid supplies 62 (gas or liquid supplies), a vacuum supply 64, a first temperature regulator 66, a second temperature regulator 68, and a delivery subsystem 70. The first temperature regulator 66 controls the temperature of a first fluid provided by the fluid supplies 62 (e.g., heats the first fluid to a first temperature). Similarly, the second temperature regulator 68 controls the temperature of a second fluid provided by the fluid supplies 62 (e.g., cools the second fluid, heats the second fluid to a temperature that is less than the first temperature, etc.). The delivery subsystem 70, which includes a mechanical positioning assembly and the nozzle 20 among other things, controls (i) positioning of the nozzle 20 relative to the circuit board 24 and (ii) application of fluids and the vacuum, in response to commands from a technician overseeing the installation of the module 22 on the circuit board 24.

In one arrangement, the module installation system 60 includes a computer which runs an application provided by a computer program product 71. The computer, under direction of the application operates to form portions of the first temperature regulator 66, the second temperature regulator 68 and the delivery subsystem 70.

As further shown in FIG. 3, the module installation assembly 60 can be illustrated in a simpler form as a first temperature source 72 (e.g., one of the fluid supplies 62 in combination with the first temperature regulator 66), a second temperature source 74 (e.g., another of the fluid supplies 62 in combination with the second temperature regulator 68), a vacuum source 76 (the vacuum supply 64), a controller 78, connecting media 80 (e.g., flexible tubing or hoses), and the nozzle 20. A technician operates the controller 78 to install the module 22 on the circuit board 24. Further details of the operation of the module installation system 60 will now be provided with reference to FIG. 4.

Figure 4:
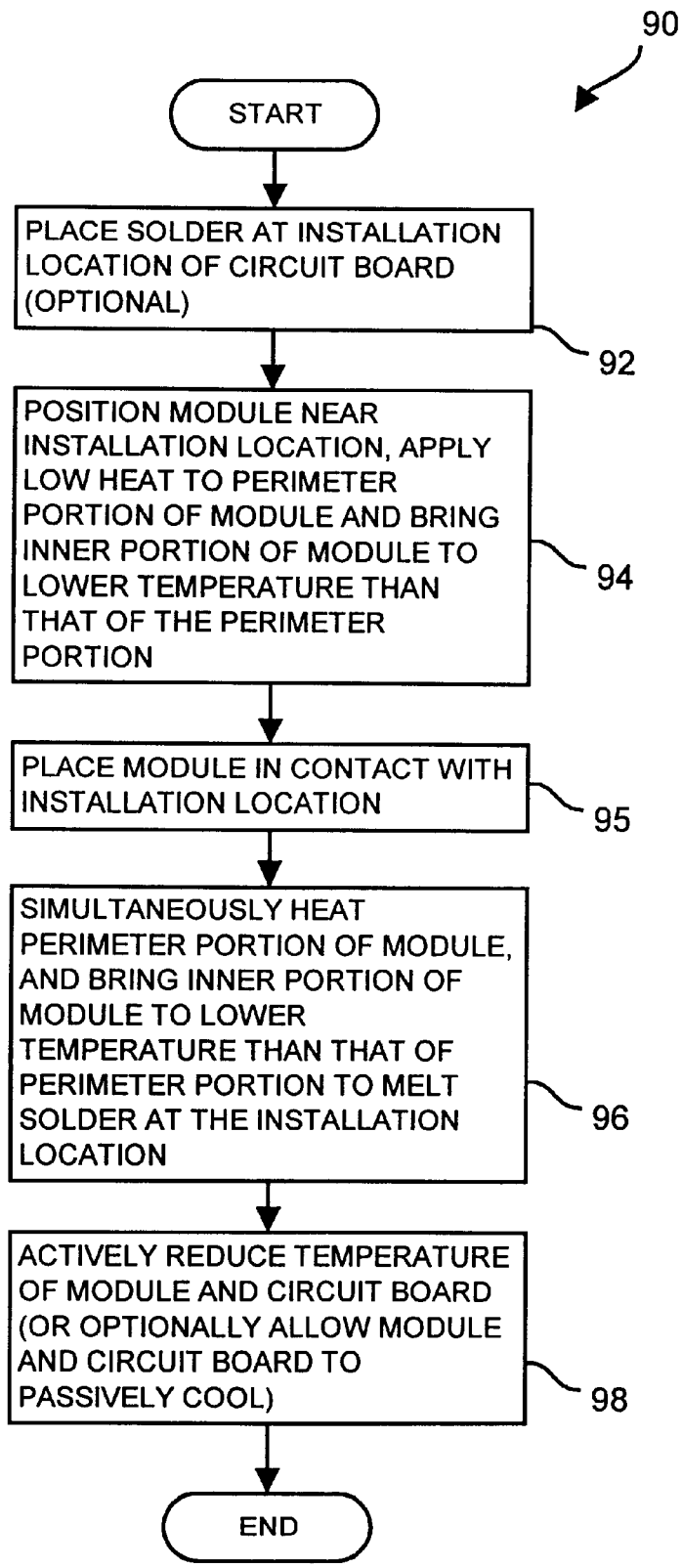
FIG. 4 is a flow diagram illustrating a procedure performed by the module installation system of FIG. 3.

FIG. 4 illustrates a procedure 90 which is performed by the module installation system 60 to install the module 22 on the installation location 44 of the circuit board 24. In step 92, the module installation system 60 optionally places solder at the installation location 44 of the circuit board 24. This solder supplements any solder attached to the module 22 (e.g., solder balls attached to a BGA module). In one arrangement, the technician operates the controller 78 such that the controller 78 aligns a solder dispenser (not shown) over the installation location 44 to enable the solder dispenser to dispense solder over the installation location 44 in an automated and consistent manner.

In step 94, the module installation system 60 positions the module 22 over the installation location 44 of the circuit board 24 (e.g., a few thousandths of an inch above the installation location 44). In one arrangement, the module 22 initially rests on a small staging platform. The technician places the nozzle 20 over the platform and directs the controller 78 to provide a vacuum from the vacuum source 74. The vacuum is applied through the vacuum passage 38 defined by the vacuum tube 32 of the module 22 such that the module 22 attaches to the nozzle 20 by suction. The technician then directs the controller 78 to align the nozzle 20 over the installation location 44 of the circuit board 24 and to lower the nozzle 20 (see dashed arrow of FIG. 3) so that the module 22 resides just above the circuit board 24.

At this time, the module 22 is out of contact with the circuit board 24 and correctly positioned over the installation location 44 of the circuit board 24. The technician then directs the controller 78 to begin a temperature change sequence. In one arrangement, this sequence involves directing the controller 78 to operate valves which control the first and second temperature sources 72, 74. In response, the controller 78 opens a valve to the first temperature source 72 to apply fluid (a gas or a liquid) a low heat from the first temperature source 72 to the perimeter portion 40 through the first fluid passage 34 of the nozzle 20 (see ducts 52 in FIG. 1). Additionally, the controller 78 opens a valve to the second temperature source 74 to apply a relatively cooler fluid (e.g., a cooled gas, a room temperature gas, or a heated gas that is at a lower temperature than the first fluid) from the second temperature source 74 to the inner portion 42 of the module 22 through the second fluid passage 36 of the nozzle 20 (see chamber 50 of FIG. 1).

In one arrangement, the first and second fluids are gases (e.g., nitrogen) which are applied at substantially the same pressure (e.g., four psi). In this arrangement, the temperature of the first fluid is initially less than the solder melting point (e.g., around 30 degrees Fahrenheit less than a melting point of 361 degrees Fahrenheit for a tin-lead solder).

In one arrangement, the second fluid is heated but at a lower temperature than that of the first fluid. In this arrangement, the application of the first and second fluids preferably continues for a period of time to stabilize the temperatures of the perimeter and inner portions 40, 42 of the module 22 in order to provide a heat soke phase similar to that of large furnace fabrication facilities. Here, the temperature differential between the inner portion 42 and the perimeter portion 40 remains relatively close thus minimizing stresses and possible damage that could otherwise result from a larger temperature difference.

In step 95, the module installation system 60 places the module 22 in contact with the circuit board 24 by lowering the module 22 onto the installation location 44 of the circuit board 24. During this step, the module installation assembly 60 continues to apply low heat (i.e., the first fluid) to the perimeter portion 40 of the module 22, and to apply a relatively cooler temperature (i.e., the second fluid) to the inner portion 42 of the module 22 through the nozzle 20.

In step 96, the module installation system 60 simultaneously heats the perimeter portion 40 and brings the inner portion 42 of the module 22 to a relatively lower temperature than that of the perimeter portion 40 in order to melt solder at the installation location 44 while protecting the inner portion 42. In particular, the module installation system 60 increases the temperature of the heat applied to the perimeter portion 40 (i.e., the temperature of the first fluid) to a temperature that is above the melting point of the solder in a controlled and consistent manner, while continuing to apply a relatively cooler temperature to the inner portion 42.

In one arrangement, the increased heat is applied for a short period of time in the form of a heat spike. During this short time period, the temperature adjacent the perimeter portion 40 of the module 22 increases enough to melt the solder between the module 22 and the circuit board 24. The time period is preferably kept short in order to prevent distribution of the increased heat to other areas thus preventing unintended solder reflows.

In one arrangement, the temperature change event of steps 94 through 96 takes approximately two minutes to complete.

In step 98, the module installation system 60 actively lowers the temperature of the module 22 and the circuit board 24 in a controller manner. In particular, the controller 78 reduces the temperature of the first and second fluids in a gradual manner to prevent extreme temperature transitions from occurring within the module 22, the circuit board 24 and the newly formed solder joints between the module 22 and the circuit board 24 that could otherwise become the source of damage. Subsequently, the controller 78 closes the valves to first temperature source 72, the second temperature source 74 and the vacuum 76 and raises the nozzle 20 leaving the module 22 mounted to the circuit board 24 at the installation location 44.

In an alternative arrangement, if it is unlikely that such sharp temperature change stresses will cause damage to the module or the solder connections, step 98 simply involves closing the valves to the first and second temperature sources 72, 74 and the vacuum 76 and raising the nozzle 20. This allows the module 22 and the circuit board 24 to passively cool, and reduces installation time as well.

Details of various nozzle arrangements 100, 110, 120 and 130 will now be provided with reference to FIGS. 5–8. Each arrangement includes a nozzle 20, a module 22 and a circuit board 24 in their relative positions during step 94, i.e., as the module installation system 60 positions the nozzle 20 and the module 22 over the circuit board 24 for installation (see dashed arrow in each of FIGS. 5–8). It should be understood that, in each arrangement, the nozzle 20 includes a vacuum tube (e.g., see vacuum tube 32 in FIGS. 1–2) even though the vacuum tube has been purposefully left out of FIGS. 5–8 for simplification. Additionally, it should be understood that the module 22 is shown in FIGS. 5–8 as a BGA module by way of example only, and that a few solder balls 102 of the module 22 are shown merely to illustrate that the module 22 is a BGA module.

Figure 5:
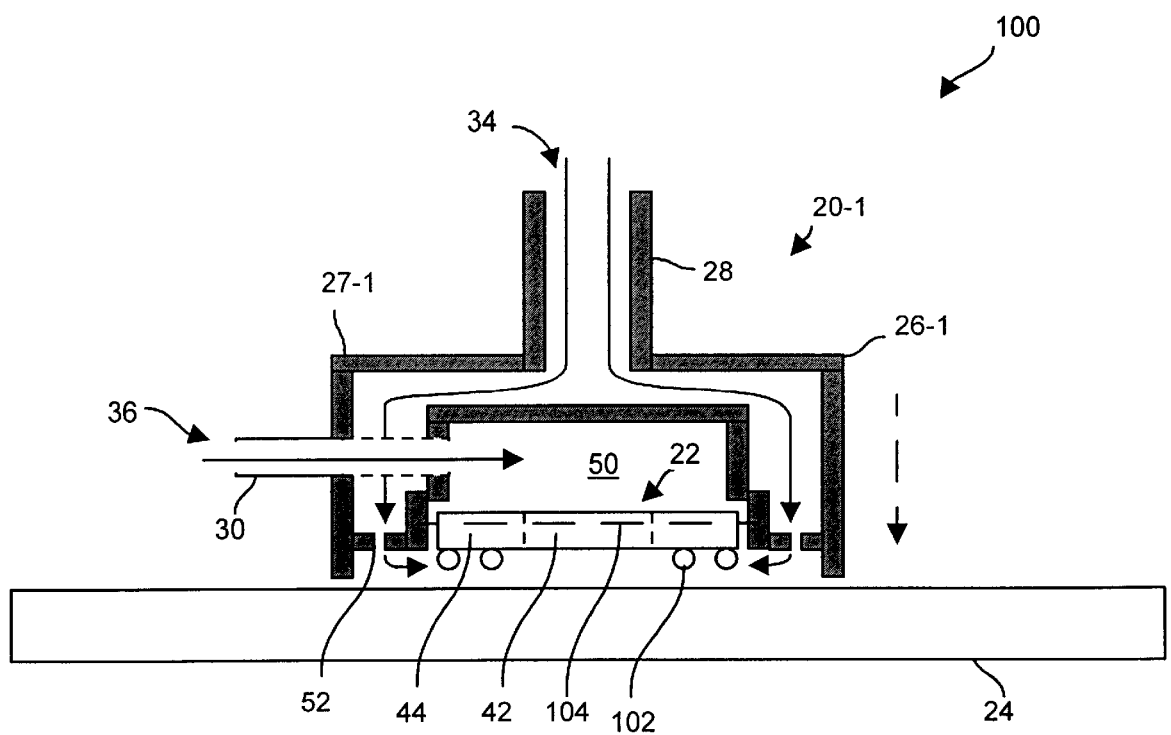
FIG. 5 is a cross-sectional view of a nozzle having a single port to receive a fluid (i.e., a gas or liquid) for bringing the inner portion of the module of FIG. 1 to a temperature that is lower than that of the perimeter portion.

FIG. 5 shows a general cross-sectional view of an arrangement 100 which is suitable for use by the invention. The arrangement 100 includes a nozzle 20-1, a module 22 and a circuit board 24. The nozzle 20-1 is generally the nozzle 20 of FIGS. 1–2 in that the nozzle 20-1 includes a housing 26-1 having a base portion 27-1 and an upper portion 28 through which extends a first fluid passage 34. The nozzle 20-1 further includes a port 30 attached to the base portion 27-1 through which extends a second fluid passage 36.

As shown by the solid arrows in FIG. 5, a first fluid (e.g., a heated gas) is capable of flowing through the first fluid passage 34 and out ducts 52 to an area adjacent a perimeter portion 40 of the module 22. Similarly, a second fluid (e.g., a cooled gas, a room temperature gas, or a heated gas that is at a lower temperature than the first fluid) is capable of flowing through the second fluid passage 36 into a chamber 50 to an area adjacent an inner portion 42 of the module 22.

In one arrangement, the first and second fluids are gases (e.g., nitrogen) which are applied as the same pressure (e.g., four psi) in order to form a gas curtain 104 between the chamber 50 and regions beneath the perimeter portion 40 of the module 22 at which solder connections are formed. In one arrangement, the temperature difference across the gas curtain 104 is 30 to 40 degrees Celsius, i.e., there is a 30 to 40 degree Celsius thermal separation between the chamber 50 and the area adjacent the perimeter portion 40 of the module 22.

In one arrangement, the second fluid is a cooling gas that is sufficient to cool circuitry and/or components residing on the bottom of the module 22. In particular, during installation of an MCM, the expanding cooling gas within the chamber 50 (the second fluid) causes a cooling affect which cools the top surface of the inner portion 42 of the module 22 thereby reducing the temperature of the bottom surface of the inner portion 42.

Figure 6:
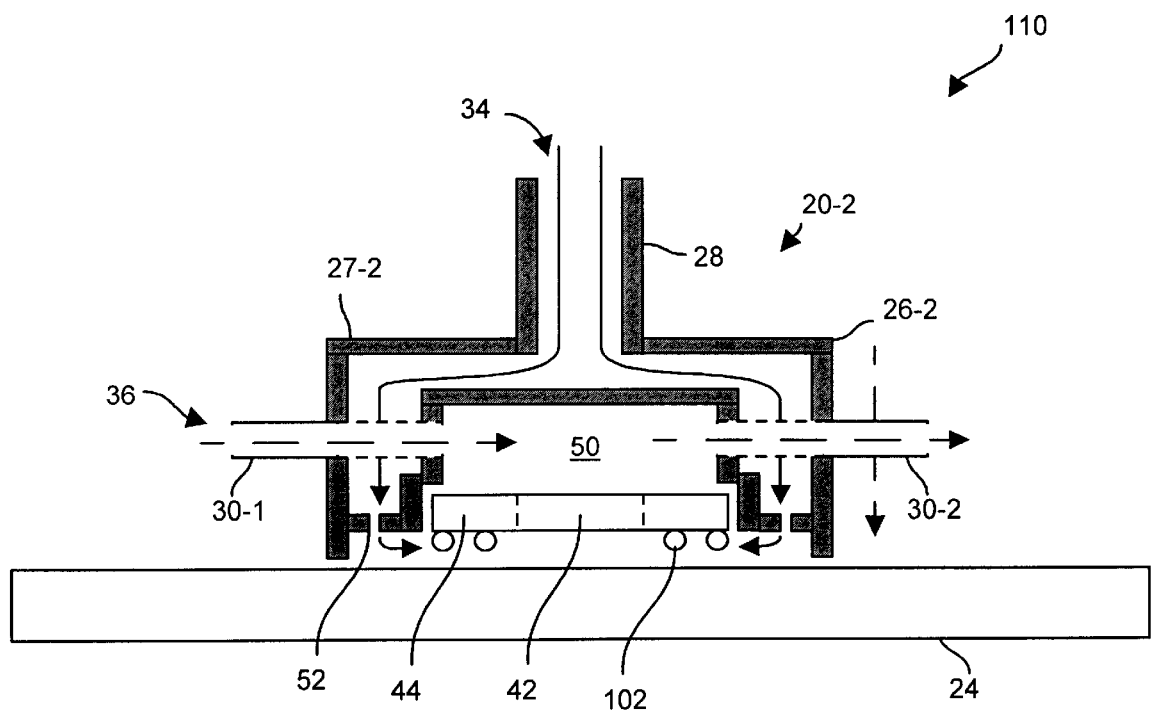
FIG. 6 is a cross-sectional view of a nozzle having multiple ports for transferring a fluid in order to bring the inner portion of the module of FIG. 1 to a temperature that is lower than that of the perimeter portion.

FIG. 6 shows a general cross-sectional view of an arrangement 110 which is suitable for use by the invention. The arrangement 110 includes a nozzle 20-2, having a base portion 27-2 and an upper portion 28. The nozzle 20-2 is similar to the nozzle 20-1 of FIG. 5. However, the base portion 27-2 of the nozzle 20-2 connects with multiple ports 30. In particular, the nozzle 20-2 includes an input port 30-1 which leads into the chamber 50, and an output port 30-2 which leads from the chamber 50. Accordingly, during module installation (i.e., step 96 of the procedure 90 of FIG. 4) the cooler fluid follows the second fluid passage 36 by entering the chamber 50 through the input port 30-1 and exiting the chamber 50 through the output port 30-2.

In one arrangement, the first and second fluids are gases (e.g., heated nitrogen and cooled nitrogen, respectively). In this arrangement, the cooler gas (the second fluid) expanding as it exits the chamber 50 through the output port 30-2 generates, in part, a cooling affect on the inner portion 42 of the module 22. That is, the continuous passing (or flow) of the cooler gas through the chamber 50 provides superior temperature transfer between the inner portion 42 of the module 22 and the cooler gas due to the constant movement of the cooler gas over the top surface of the inner portion 42.

Figure 7:
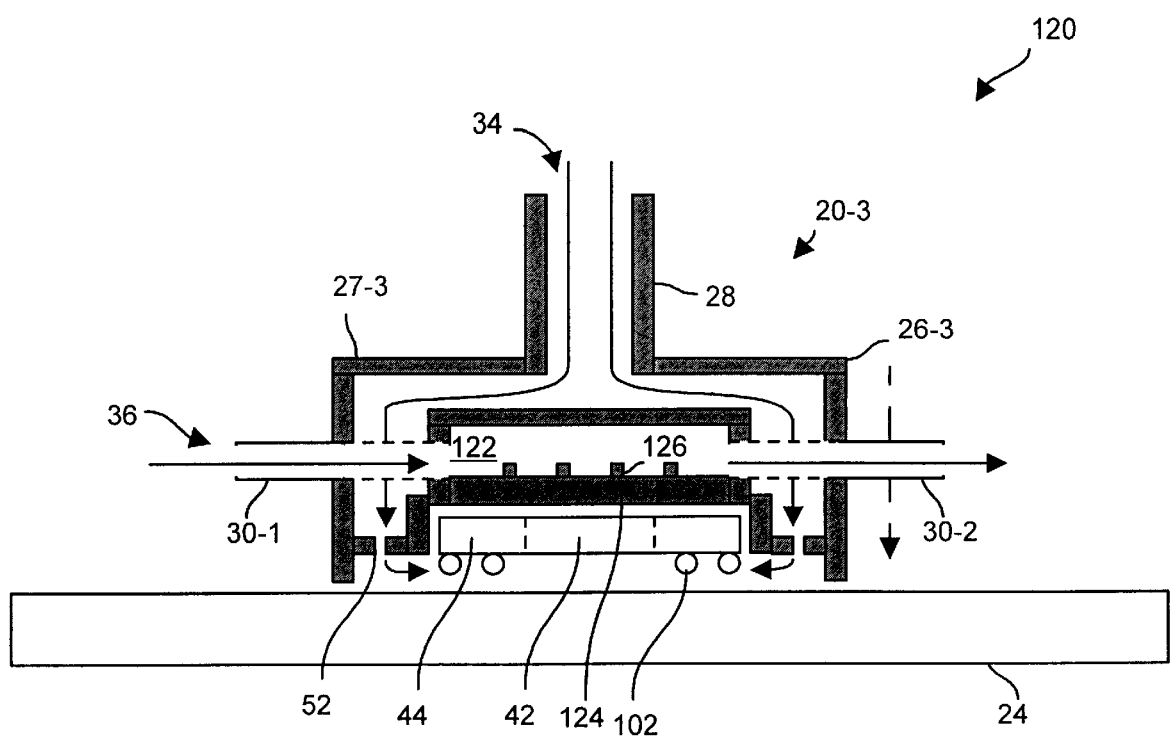
FIG. 7 is a cross-sectional view of a nozzle having a baffled thermal mass for bringing the inner portion of the module of FIG. 1 to a temperature that is lower than that of the perimeter portion.

FIG. 7 shows a general cross-sectional view of an arrangement 120 which is suitable for use by the invention. The arrangement 120 includes a nozzle 20-3, having a base portion 27-3 and an upper portion 28. The nozzle 20-3 is similar to the nozzle 20-2 of FIG. 6 in that it has multiple ports 30. However, the base portion 27-3 further includes a separation member 124 that separates the second fluid passage 36 from the module 22 to form an enclosed chamber 122 in order to prevent competition between the first and second fluids. The separation member 124 includes baffles 126 which extend into the second fluid passage 36. The separation member 124 operates as a thermal capacitor by maintaining a relatively low temperature, while conducting heat from the inner portion 42 of the module 22 and transferring it using the baffles 126 to the cooler fluid flowing through the second fluid passage 36 during module installation.

In one arrangement, the first and second fluids are both gases (e.g., nitrogen). In another arrangement, the first fluid is a gas (e.g., heated nitrogen) and the second fluid is a liquid gel. In some situations, the liquid gel retains temperature (e.g., a temperature that is cooler than the first fluid) better than a gas thus making use of the gel more effective than the gas. Furthermore, the gel can be recycled to prevent waste.

Figure 8:
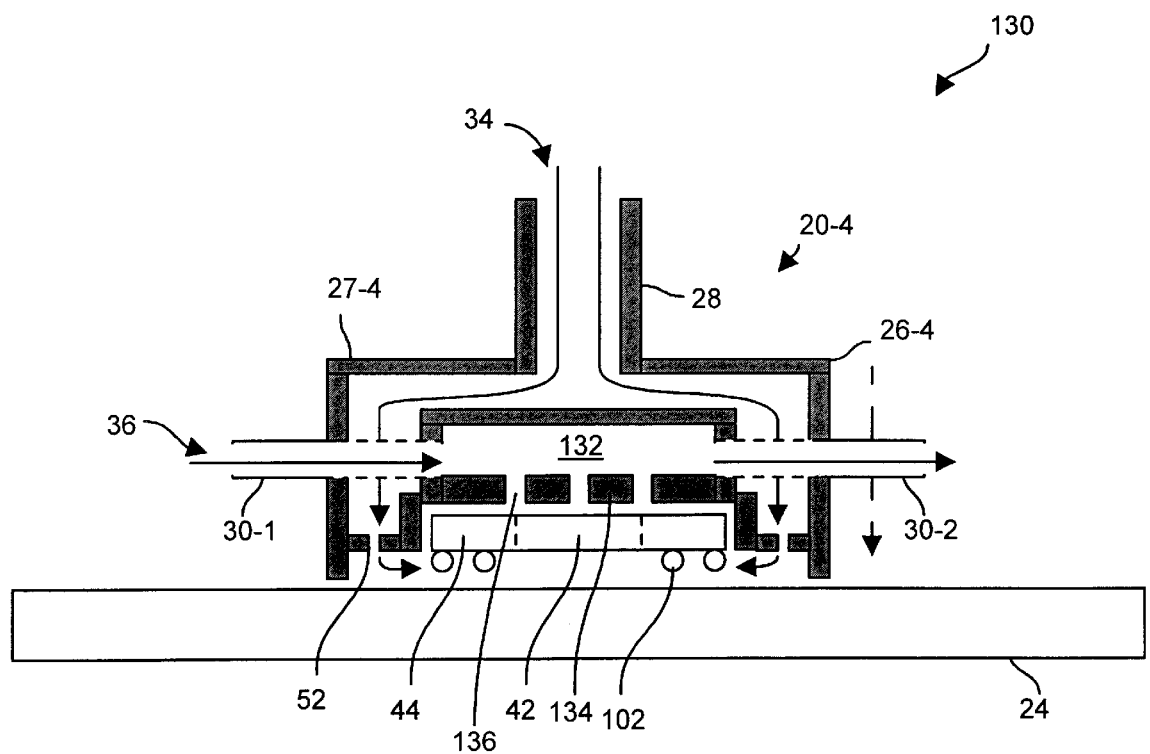
FIG. 8 is a cross-sectional view of a nozzle having a thermal mass with multiple bleed orifices for bringing the inner portion of the module of FIG. 1 to a temperature that is lower than that of the perimeter portion.

FIG. 8 shows a general cross-sectional view of an arrangement 130 which is suitable for use by the invention. The arrangement 130 includes a nozzle 20-4, having a base portion 27-4 and an upper portion 28. The nozzle 20-4 is similar to the nozzle 20-3 of FIG. 7 in that the base portion 27 includes a separation member 134 that forms a chamber 132. However, the separation member 134 does not completely separate the second fluid passage from the module 22. Rather, the separation member 134 includes bleed orifices 136 that direct some of the cooler fluid, which flows through the second fluid passage 36, toward particular areas of the inner portion 42 of the module 22. Accordingly, the bleed orifices 136 can provide localized cooling effects to particular regions of the inner portion 42 (e.g., over critical circuitry or components). In one arrangement, the first and second fluids are both gases (e.g., nitrogen).

As described above, the invention is involves techniques for installing a module on a circuit board by simultaneously heating to a perimeter portion of the module, and bringing an inner portion of the module to a temperature that is lower than that the perimeter portion. Bringing the inner portion to a lower temperature prevents heat-related damage to circuitry at the inner portion. In particular, use of the invention can prevent unintended solder reflows of components attached to inner portions of MCMs. Without the invention, such reflows could form unreliable cold solder joints or perhaps cause components to detach from the MCM boards. The features of the invention may be particularly useful when applied to devices manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the perimeter portion 40 of the module 22 to which heat is applied need not be contiguous around the module 22. Rather, the perimeter portion 40 to which heat is applied can be a smaller area such as only one or two edges of the module 22. Similarly, the inner portion 42, which is brought to a lower temperature than that of the perimeter portion, need not be centered and symmetrical within the module 22. Rather, the inner portion 42 can be closer to one edge of the module 22, or form a non-symmetrical shape.

Additionally, it should be understood that the first and second fluids can be different gases. Nitrogen is provided by way of example only as a gas that is suitable for both the first and second fluids. It should be understood that when the first and second fluids are the same gas, the module installation system 60 simply can include a single fluid supply 62 rather than multiple fluid supplies 62.

Furthermore, it should be understood that various changes can be made to the nozzle 20 to improve the nozzle's ability to heat the perimeter portion 40 of the module 22 and bring the inner portion 42 of the module 22 to a lower temperature than that of the inner portion 42. For example, posts can be added to the bottom of the nozzle 20 to allow the heated gas applied to the perimeter portion 40 to escape. The constant flow of heated gas by the perimeter portion 40 enhances temperature transfer from the heated gas to areas adjacent the perimeter portion 40 in order to form solder connections between the module 22 and the circuit board 24.

Additionally, it should be understood that the above-described features of the invention are not only suitable for installing a module on a circuit board, but also for removing a module from a circuit board. That is, the same nozzles can be used to apply heat to existing solder connections in order to detach a module (e.g., a faulty module) from an existing installation location on a circuit board. Accordingly, the features of the invention are suitable for assembly rework stations in which technicians not only install new modules onto circuit boards, but also remove existing modules from circuit boards.

Furthermore, a variety of solders are suitable for use by the invention. One arrangement uses eutectic solder such as tin-lead solder having a melting point of 361 degrees Fahrenheit. The use of eutectic solder provides for easier control over the state of the solder, i.e., solid vs. liquid, by avoiding an intermediate putty-like state which can easily form unreliable cold joints in response to minor vibrations or jolts during module installation. However, it should be understood that other solders are also suitable for use by the invention (e.g., tin-silver, lead-bismuth, etc.). Additionally, in one arrangement, the temperature of the first fluid is preferably above the solder melting point, and the temperature of the second fluid is preferably below the solder melting point.

Also, it should be understood that the module 22 is described as a BGA module by way of example only. The invention is suitable for installing other types of modules as well such as non-BGA components (e.g., lead frame modules), plastic components (e.g., connectors and adapters), ceramic components, packages that prefer differential cooling, hybrid circuits, peripheral array packages, etc.

What is claimed is:

1. A method for installing a module on a circuit board, the method comprising the steps of:
   positioning the module on an installation location of the circuit board, the module having a perimeter portion and an inner portion; and
   simultaneously (i) heating the perimeter portion of the module, and (ii) cooling the inner portion of the module such that the perimeter portion moves to a substantially different temperature than that of the inner portion in order to install the module on the circuit board.

2. The method of claim 1 wherein the step of simultaneously heating and cooling includes the steps of:
   applying a first fluid to an area adjacent the perimeter portion of the module; and
   applying a second fluid to an area adjacent the inner portion of the module.

3. The method of claim 2 wherein the step of applying the first fluid includes the step of:
   providing a first gas, as the first fluid, to the area adjacent the perimeter portion of the module;
   and wherein the step of applying the second fluid includes the step of:
   providing a second gas, as the second fluid, to the area adjacent the inner portion of the module.

4. The method of claim 3 wherein the step of providing the first gas includes the step of:
   providing the first gas at a particular pressure;
   and wherein the step of providing the second gas includes the step of
   providing the second gas at a pressure that is substantially the same as the particular pressure.

5. The method of claim 1 wherein the step of simultaneously heating and cooling includes the step of:
   bringing the inner portion of the module to a temperature that is substantially lower than that of the perimeter portion.

6. The method of claim 2, further comprising the step of:
   positioning eutectic solder between contact members of the perimeter portion of the module and the circuit board prior to positioning the module on the installation location of the circuit board, the eutectic solder having a melting point such that the eutectic solder melts during the step of simultaneously heating and cooling in order to form connections between the contact members of the perimeter portion of the module and the circuit board.

7. The method of claim 2 wherein solder resides between contact members of the perimeter portion of the module and the circuit board, and wherein the step of applying the first fluid includes the step of:
   providing the first fluid at a temperature that is higher than a melting point of the solder;
   and wherein the step of applying the second fluid includes the step of:
   providing the second fluid at a temperature that is lower than the melting point of the solder.

8. A method for installing a module on a circuit board, the method comprising the steps of:
   positioning the module on an installation location of the circuit board, the module having a perimeter portion and an inner portion; and
   simultaneously heating the perimeter portion of the module, and cooling the inner portion of the module in order to install the module on the circuit board, wherein the step of simultaneously heating and cooling includes the steps of (i) applying a first fluid to an area adjacent the perimeter portion of the module, and (ii) applying a second fluid to an area adjacent the inner portion of the module, wherein the step of applying the first fluid includes the step of:
   providing a gas, as the first fluid, to the area adjacent the perimeter portion of the module;
   and wherein the step of applying the second fluid includes the step of:
   providing a liquid, as the second fluid, to the area adjacent the inner portion of the module.

9. A method for installing a module on a circuit board, the method comprising the steps of:
   positioning the module on an installation location of the circuit board, the module having a perimeter portion and an inner portion; and
   simultaneously heating the perimeter portion of the module, and cooling the inner portion of the module in order to install the module on the circuit board, wherein the step of simultaneously heating and cooling includes the steps of (i) applying a first fluid to an area adjacent the perimeter portion of the module, and (ii) applying a second fluid to an area adjacent the inner portion of the module, wherein the step of applying the second fluid includes the step of:
   passing the second fluid through a chamber of a housing which is in contact with the inner portion of the module.

10. The method of claim 9 wherein the step of passing the second fluid through the chamber of the housing includes the step of:

passing the second fluid (i) through an input port, coupled to the housing, which defines an opening leading into the chamber, (ii) over multiple baffles within the chamber which are defined by the housing, and (iii) through an output port, coupled to the housing, which defines an opening leading from the chamber.

11. The method of claim 9 wherein the step of passing the second fluid through the chamber of the housing includes the step of:

passing the second fluid (i) through an input port, coupled to the housing, which defines an opening leading into the chamber, (ii) over a bleed orifice which is defined by the housing, and (iii) through an output port, coupled to the housing, which defines an opening leading from the chamber.

12. A module installation system for installing a module on a circuit board, the module having a perimeter portion and an inner portion, the module installation system comprising:

a heating source;

a cooling source; and a nozzle, coupled to the heating and cooling sources, that is configured to simultaneously (i) heat the perimeter portion of the module, and (ii) cool the inner portion of the module in order to install the module on the circuit board.

13. The module installation system of claim 12 wherein the heating source provides a first fluid, wherein the cooling source provides a second fluid, and wherein the nozzle applies the first fluid to an area adjacent the perimeter portion of the module, and the second fluid to an area adjacent the inner portion of the module.

14. The module installation system of claim 13 wherein the heating source provides a first gas as the first fluid; and wherein the cooling source provides a second gas as the second fluid.

15. The module installation system of claim 14, further comprising:

a controller that provides the first gas from the heating source at a particular pressure, and provides the second gas from the cooling source at a pressure that is substantially the same as the particular pressure.

16. The module installation system of claim 13 wherein the heating source provides a gas as the first fluid; and wherein the cooling source provides a liquid as the second fluid.

17. The module installation system claim 13 wherein nozzle includes:

a housing that contacts the inner portion of the module and defines a chamber through which the second fluid is capable of passing.

18. The module installation system of claim 17 wherein the housing of the nozzle further defines multiple baffles that extend into the chamber, and wherein the nozzle further includes:

an input port that defines an opening leading into the chamber; and an output port that defines an opening leading from the chamber such that the second fluid is capable of passing through the input port leading into the chamber, over the multiple baffles, and through the output port leading from the chamber.

19. The module installation system of claim 17 wherein the housing of the nozzle further defines a bleed orifice, and wherein the nozzle further includes:

an input port that defines an opening leading into the chamber; and an output port that defines an opening leading from the chamber such that the second fluid is capable of passing through the input port leading into the chamber, over the bleed orifice, and through the output port leading from the chamber.

20. The module installation system of claim 13 wherein solder resides between contact members of the perimeter portion of the module and the circuit board, wherein the heating source provides the first fluid at a temperature that is higher than a melting point of the solder; and wherein the cooling source provides the second fluid at a temperature that is lower than the melting point of the solder.

21. A module installation system for installing a module on a circuit board, the module having a perimeter portion and an inner portion, the module installation system comprising:

a heating source;

a cooling source; and means, coupled to the heating and cooling sources, for simultaneously heating the perimeter portion of the module, and cooling the inner portion of the module such that the perimeter portion moves to a substantially different temperature than that of the inner portion in order to install the module on the circuit board.

22. A nozzle for installing a module on a circuit board, the module having a perimeter portion and an inner portion, the nozzle comprising:

a housing that is configured to simultaneously (i) heat the perimeter portion of the module, and (ii) cool the inner portion of the module; and a vacuum tube, coupled to the housing, that applies a vacuum to the module to receive and retain the module within the housing.

23. The nozzle of claim 22 wherein the housing defines:

a first passage through which a first fluid travels to an area adjacent the perimeter portion of the module; and a second passage through which a second fluid travels to an area adjacent the inner portion of the module.

24. The nozzle of claim 23 wherein the second passage includes a chamber that is defined by the housing, and wherein the housing includes a separation member that contacts the module, and separates the chamber from the module.

25. The nozzle of claim 24 wherein the separation member defines multiple baffles that extend into the chamber, and wherein the nozzle further comprises:

an input port which defines a first opening that leads into the chamber; and an output port which defines a second opening that leads from the chamber such that the second fluid is permitted to pass through the first opening leading into the chamber, over the multiple baffles, and through the second opening leading from the chamber.

26. The nozzle of claim 24 wherein the separation member defines a bleed orifice that extends into the chamber, and wherein the nozzle further comprises:

an input port which defines a first opening that leads into the chamber; and an output port which defines a second opening that leads from the chamber such that the second fluid is permitted to pass through the first opening leading into the chamber, over the bleed orifice defined by the separation member, and through the second opening leading from the chamber.

27. A nozzle for installing a module on a circuit board, the module having a perimeter portion and an inner portion, the nozzle comprising:

a vacuum tube that applies a vacuum to the module to receive and retain the module; and means for simultaneously heating the perimeter portion of the module, and cooling the inner portion of the module, in order to install the module on the circuit board.

28. A module installation system for installing a module on a circuit board, the module having a first portion and a second portion, the module installation system comprising:

a first heating source;

a second heating source; and a nozzle, coupled to the first and second heating sources, that is configured to simultaneously (i) heat the first portion of the module to a first temperature, and (ii) heat the second portion of the module to a second temperature that is lower than the first temperature, in order to install the module on the circuit board.

29. The module installation system of claim 28 wherein the first portion of the module is a perimeter portion of the module, wherein the second portion of the module is an inner portion of the module, and wherein the nozzle is configured to apply a fluid at the first temperature to an area adjacent the perimeter portion of the module, and a fluid at the second temperature to an area adjacent the inner portion of the module.

30. A nozzle for installing a module on a circuit board, the module having a first portion and a second portion, the nozzle comprising:

a housing that is configured to simultaneously (i) heat the first portion of the module to a first temperature, and (ii) heat the second portion of the module to a second temperature that is lower than the first temperature; and a vacuum tube, coupled to the housing, that applies a vacuum to the module to receive and retain the module within the housing.

31. The nozzle of claim 30 wherein the first portion of the module is a perimeter portion of the module, wherein the second portion of the module is an inner portion of the module, and wherein the housing is configured to apply a fluid at the first temperature to an area adjacent the perimeter portion of the module, and a fluid at the second temperature to an area adjacent the inner portion of the module.

* * * * *